United States Patent
Liu et al.

(10) Patent No.: US 10,680,463 B2
(45) Date of Patent: Jun. 9, 2020

(54) RESONANT WIRELESS POWER TRANSMITTER CIRCUIT AND CONTROL CIRCUIT AND CONTROL METHOD THEREOF

(71) Applicant: RICHTEK TECHNOLOGY CORPORATION, Zhubei, HsinChu (TW)

(72) Inventors: Kuo-Chi Liu, HsinChu (TW);
Wei-Hsin Wei, Zhubei (TW);
Chih-Hsien Wang, Taoyuan (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 751 days.

(21) Appl. No.: 15/095,087

(22) Filed: Apr. 10, 2016

(65) Prior Publication Data
US 2017/0085131 A1    Mar. 23, 2017

Related U.S. Application Data

(60) Provisional application No. 62/220,982, filed on Sep. 19, 2015.

(51) Int. Cl.
*H02J 50/12*    (2016.01)
*H03H 7/38*    (2006.01)

(52) U.S. Cl.
CPC ............... *H02J 50/12* (2016.02); *H03H 7/38* (2013.01)

(58) Field of Classification Search
CPC .................... H02J 50/12; H02J 7/08
USPC ......................................................... 307/104
See application file for complete search history.

(56) References Cited

U.S. PATENT DOCUMENTS

| | | | | |
|---|---|---|---|---|
| 4,476,578 | A | * | 10/1984 | Gaudin .................... H03H 7/38 333/17.3 |
| 2009/0243397 | A1 | * | 10/2009 | Cook ....................... H02J 5/005 307/104 |
| 2011/0133570 | A1 | | 6/2011 | Mayo et al. |
| 2012/0267960 | A1 | | 10/2012 | Low et al. |
| 2013/0033118 | A1 | | 2/2013 | Karalis et al. |
| 2015/0008755 | A1 | | 1/2015 | Sone |
| 2016/0043574 | A1 | * | 2/2016 | Low ........................ H03H 11/28 307/104 |

(Continued)

*Primary Examiner* — Rexford N Barnie
*Assistant Examiner* — Swarna N Chowdhuri
(74) *Attorney, Agent, or Firm* — Tung & Associates

(57) ABSTRACT

The present invention discloses a resonant wireless power transmitter circuit, which has an input impedance. The resonant wireless power transmitter circuit includes: a driver circuit coupled with a power supply, which includes at least a power switch; a switching resonant control circuit coupled with the driver circuit, such that the driver operates at a pre-determined or a variable resonant frequency; an adjustable impedance matching circuit coupled with the driver circuit, which includes at least a varactor; a transmitter circuit coupled with the impedance matching circuit and the driver circuit, which includes at least a transmitter coil; and an impedance control circuit coupled with the adjustable impedance matching circuit and the driver circuit, which provides an impedance control signal to control the reactance of the varactor, such that the input impedance of the resonant wireless power transmitter circuit is matched at the pre-determined or the variable resonant frequency.

19 Claims, 14 Drawing Sheets

(56) References Cited

U.S. PATENT DOCUMENTS

2016/0112028 A1* 4/2016 Baier .................... H01L 23/495
 343/861
2016/0359467 A1* 12/2016 Govindaraj ............. H02J 5/005

* cited by examiner

RESONANT WIRELESS POWER TRANSMITTER CIRCUIT AND CONTROL CIRCUIT AND CONTROL METHOD THEREOF

CROSS REFERENCE

The present invention claims priority to U.S. 62/220,982, filed on Sep. 19, 2015.

BACKGROUND OF THE INVENTION

Field of Invention

The present invention relates to a resonant wireless power transmitter circuit. Particularly it relates to a resonant wireless power transmitter circuit with an adjustable impedance matching circuit. The present invention also relates to a control circuit and a control method of the resonant wireless power transmitter circuit.

Description of Related Art

FIG. 1 shows a prior art resonant wireless power transmitter circuit. The resonant wireless power transmitter circuit 1 includes a power supply VDD, two power switches Q1 and Q2, a transmitter coil L1, an impedance matching capacitor Cs, and a zero voltage switching tank 29 (ZVS tank) which includes an inductor Lzvs and a capacitor Czvs. The zero voltage switching tank 29 is connected with the power switch Q1 in parallel, and its resonant frequency is set to a low frequency for providing an inductive load for the resonant wireless power transmitter circuit 1.

The prior art circuit shown in FIG. 1 have larger operation currents through power switches Q1 and Q2 and a larger switching loss when the power switches are switched to not conductive.

FIG. 2 shows an architecture according to another prior art disclosed by US patent US2011/0133570. The power VTX_PWR of the prior art resonant wireless power transmitter circuit 2 can be lower, but in order to achieve this, it needs extra inductors and capacitors.

FIG. 3 shows another prior art resonant wireless power transmitter circuit disclosed by US patent US2012/0267960. The resonant wireless power transmission system 3 includes a transmitter circuit 24 and a receiver circuit 41. The transmitter circuit 24 includes a transmitter coil which has an inductance Lp. Rp stands for the parasitic resistance of the transmitter circuit 24. Cp is a capacitor for impedance matching. Cd and a switch 820 connected with Cd form an impedance matching circuit 23 for adjusting impedance matching. The receiver circuit includes a receiver coil which has an inductance Ls. Rs stands for the parasitic resistance of the receiver circuit 41. Cs is a capacitor for impedance matching. The prior art in FIG. 3 proposes multiple combinations of the switch(es) and capacitor(s), and switches the switches to change the reactance of the impedance matching circuit, so as to adjust the resonant frequency of the resonant wireless power transmitter circuit.

The prior art in FIG. 3 has a drawback that there will be unavoidable quantization errors when adjusting the reactance by switching the switch 820, and hence, there still will be power loss. To reduce the quantization errors requires more circuit devices, which increases the cost.

Compared to the prior art in FIG. 1, the present invention has advantages of a higher operation efficiency and that no inductor is required in the impedance matching circuit.

Compared to the prior art in FIG. 2, the present invention requires less devices and the impedance matching circuit does not require an inductor.

Compared to the prior art in FIG. 3, the present invention has advantages of analog continuous adjustment in impedance matching tuning, no quantization error, lower power loss, and higher operation efficiency. And the present invention requires less devices.

The present invention provides a resonant wireless power transmitter circuit which has a capability of automatically adjusting the impedance matching and does not require an inductor in the impedance matching circuit.

SUMMARY OF THE INVENTION

From one perspective, the present invention provides a resonant wireless power transmitter circuit having an input impedance, comprising: a driver circuit, which is coupled to a power supply, wherein the driver circuit includes at least a power switch; a switching resonant control circuit, which is coupled to the driver circuit, and configured to control the driver circuit such that the driver circuit operates at a pre-determined resonant frequency; an adjustable impedance matching circuit, which is coupled to the driver circuit, wherein the adjustable impedance matching circuit includes at least one varactor, and has an impedance; a transmitter circuit, which is coupled to the adjustable impedance matching circuit and the driver circuit, wherein the transmitter circuit includes at least a transmitter coil, wherein the driver circuit is configured to drive the transmitter coil by switching the power switch thereof; and an impedance control circuit, which is coupled to the driver circuit and the adjustable impedance matching circuit, and configured to operably generate an impedance control signal to control a reactance of the varactor so as to control the impedance of the adjustable impedance matching circuit such that the input impedance of the resonant wireless power transmitter circuit is matched at the pre-determined frequency.

In one embodiment, the adjustable impedance matching circuit includes one of the following combinations (A) and (B): wherein the adjustable impedance matching circuit includes two or more varactors, and the two or more varactors are connected in parallel, in series, or in combination of parallel and series; and wherein the adjustable impedance matching circuit includes one or more varactors and one or more capacitors, and the one or more varactors and the one or more capacitors are connected in parallel, in series, or in combination of parallel and series.

In one embodiment, the adjustable impedance matching circuit is configured to operably generate the impedance control signal according to a signal related to a phase difference between a voltage and a current of the transmitter coil.

In one embodiment, the adjustable impedance matching circuit is configured to operably generate the impedance control signal according to a switching time signal of the power switch and a signal related to a current of the transmitter circuit or related to a current of the power switch.

In one embodiment, the adjustable impedance matching circuit is configured to operably generate the impedance control signal according to a phase difference between the switching time signal of the power switch and the signal related to the current of the transmitter circuit or related to the current of the power switch.

In one embodiment, the adjustable impedance matching circuit is configured to operably generate the impedance control signal according to a negative direction current of the power switch.

In one embodiment, the adjustable impedance matching circuit comprises: a negative direction current detection circuit, including: a first comparator, which is configured to operably compare the current of the power switch and a first reference voltage to generate a negative direction current signal; a delay circuit, which is configured to operably delay the switching time signal of the power switch to generate a delayed switching time signal; a logic circuit, which is configured to operably mask the negative direction current signal by the delayed switching time signal to generate a negative direction current pulse; and a filter, which is configured to operably filter the delayed switching time signal to generate a filter output signal as a candidate of the impedance control signal to control a reactance of the varactor so as to control the impedance of the adjustable impedance matching circuit such that the input impedance of the resonant wireless power transmitter circuit is matched at the pre-determined frequency.

In one embodiment, the transmitter coil and the varactor and/or one or more capacitors are connected in parallel, in series, or in combination of parallel and series.

In one embodiment, the driver circuit is in one of the following forms: a half bridge driver circuit or a full bridge driver circuit or a class E driver circuit.

In one embodiment, the driver circuit is configured to be in the form of a differential class E driver circuit, wherein the driver circuit includes a first transmitter coil, and a second transmitter coil connected in series, and wherein each of the first transmitter coil and the second transmitter coil is connected with the varactor, and/or one or more capacitors in parallel, in series, or in combination of parallel and series.

From another perspective, the present invention provides an impedance control circuit, which is configured to operably control a resonant wireless power transmitter circuit which has an input impedance, wherein the resonant wireless power transmitter circuit comprises: a driver circuit, which is coupled to a power supply, wherein the driver circuit includes at least a power switch; a switching resonant control circuit, which is coupled to the driver circuit, and configured to control the driver circuit such that the driver circuit operates at a pre-determined resonant frequency; and an adjustable impedance matching circuit, which is coupled to the driver circuit, wherein the adjustable impedance matching circuit includes at least one varactor, and has an impedance; and a transmitter circuit, which is coupled to the adjustable impedance matching circuit and the driver circuit, wherein the transmitter circuit includes at least a transmitter coil, wherein the driver circuit is configured to drive the transmitter coil by switching the power switch thereof; the impedance control circuit comprising: a phase difference determining circuit, configured to operably determines a phase difference between a signal related to a current of the power switch (a current related signal) and a signal related to a switching time of the power switch (a switching time related signal); and a control signal selection and output circuit which is coupled to the phase difference determining circuit, configured to operably select and output an impedance control signal according to a determining result of the phase difference determining circuit, such that the input impedance of the resonant wireless power transmitter circuit is matched at the pre-determined frequency.

From another perspective, the present invention provides a method for controlling a resonant wireless power transmitter circuit which has an input impedance, wherein the resonant wireless power transmitter circuit comprises: a driver circuit, which is coupled to a power supply, wherein the driver circuit includes at least a power switch; a switching resonant control circuit, which is coupled to the driver circuit, and configured to control the driver circuit such that the driver circuit operates at a pre-determined resonant frequency; and an adjustable impedance matching circuit, which is coupled to the driver circuit, wherein the adjustable impedance matching circuit includes at least one varactor, and has an impedance; and a transmitter circuit, which is coupled to the adjustable impedance matching circuit and the driver circuit, wherein the transmitter circuit includes at least a transmitter coil, wherein the driver circuit is configured to operably drive the transmitter coil by switching the power switch thereof; the control method comprising: generating an impedance control signal; and controlling a reactance of the varactor so as to control the impedance of the adjustable impedance matching circuit such that the input impedance of the resonant wireless power transmitter circuit is matched at the pre-determined frequency.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
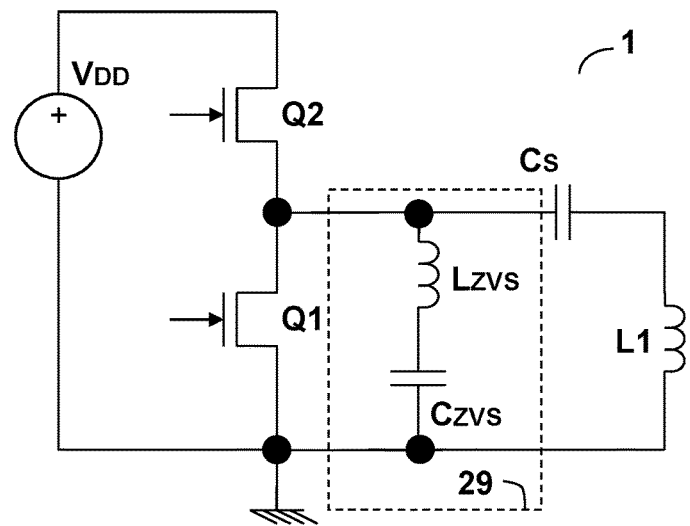
FIG. 1 shows a schematic diagram of a conventional resonant wireless power transmitter circuit and the related circuits thereof.
Figure 2:
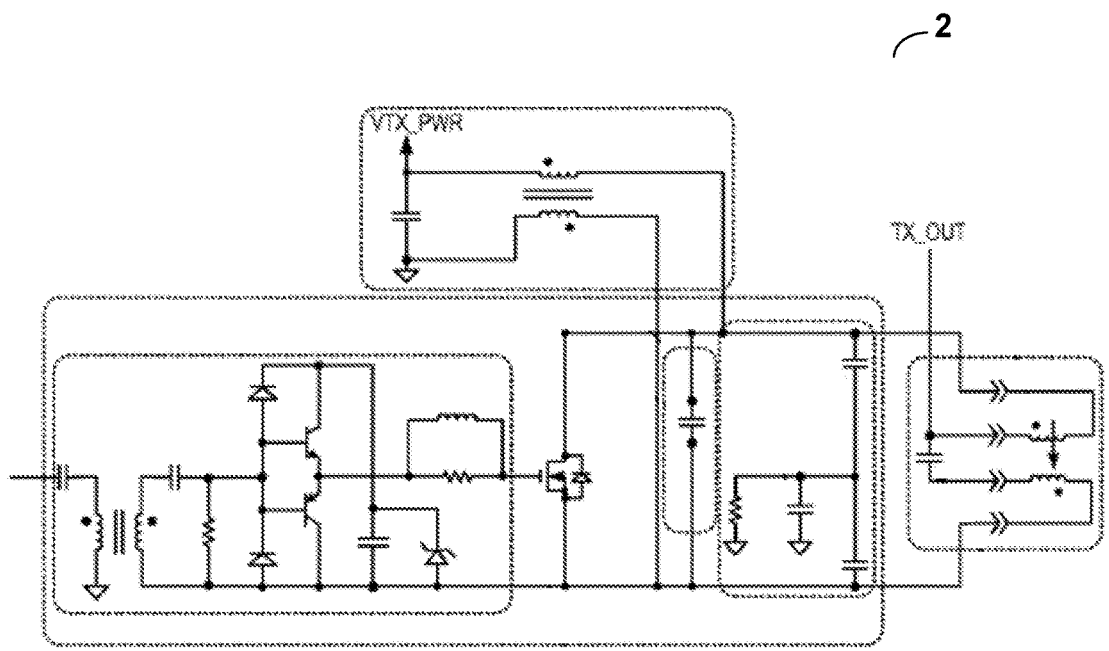
FIG. 2 shows a schematic diagram of another prior art resonant wireless power transmitter circuit.
Figure 3:
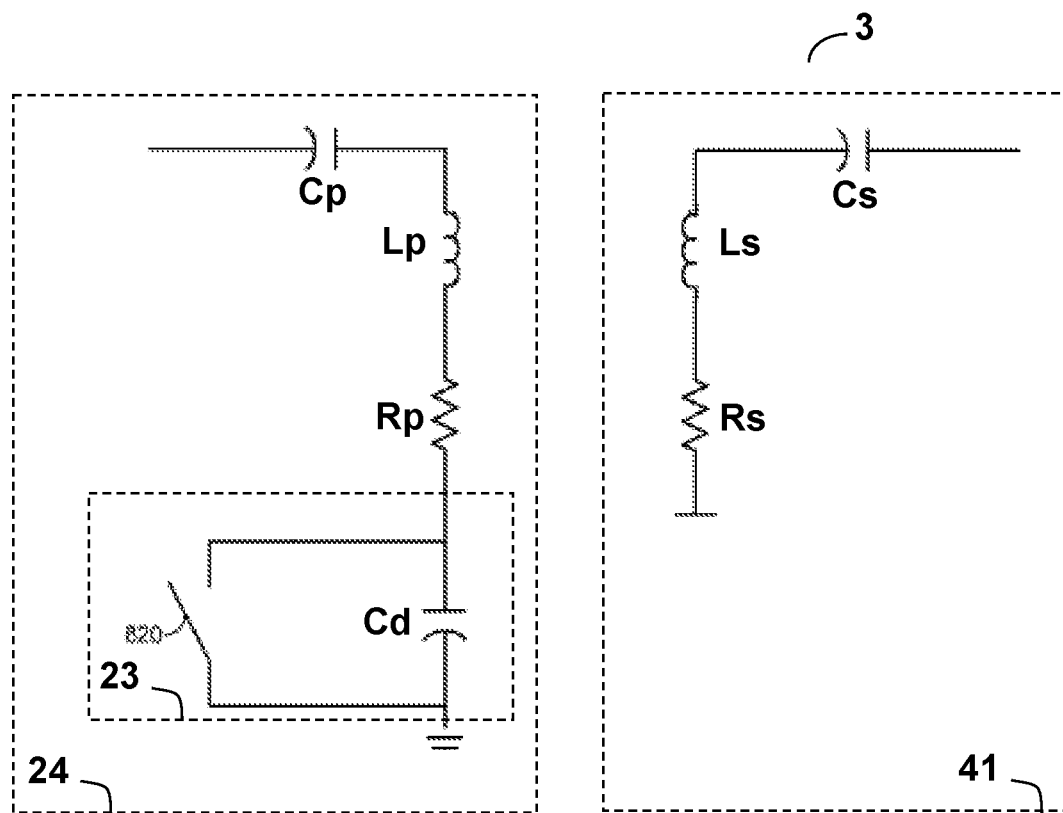
FIG. 3 shows a schematic diagram of another prior art resonant wireless power transmission system which includes a resonant wireless power transmitter circuit and a resonant wireless receiver circuit.
Figure 4:
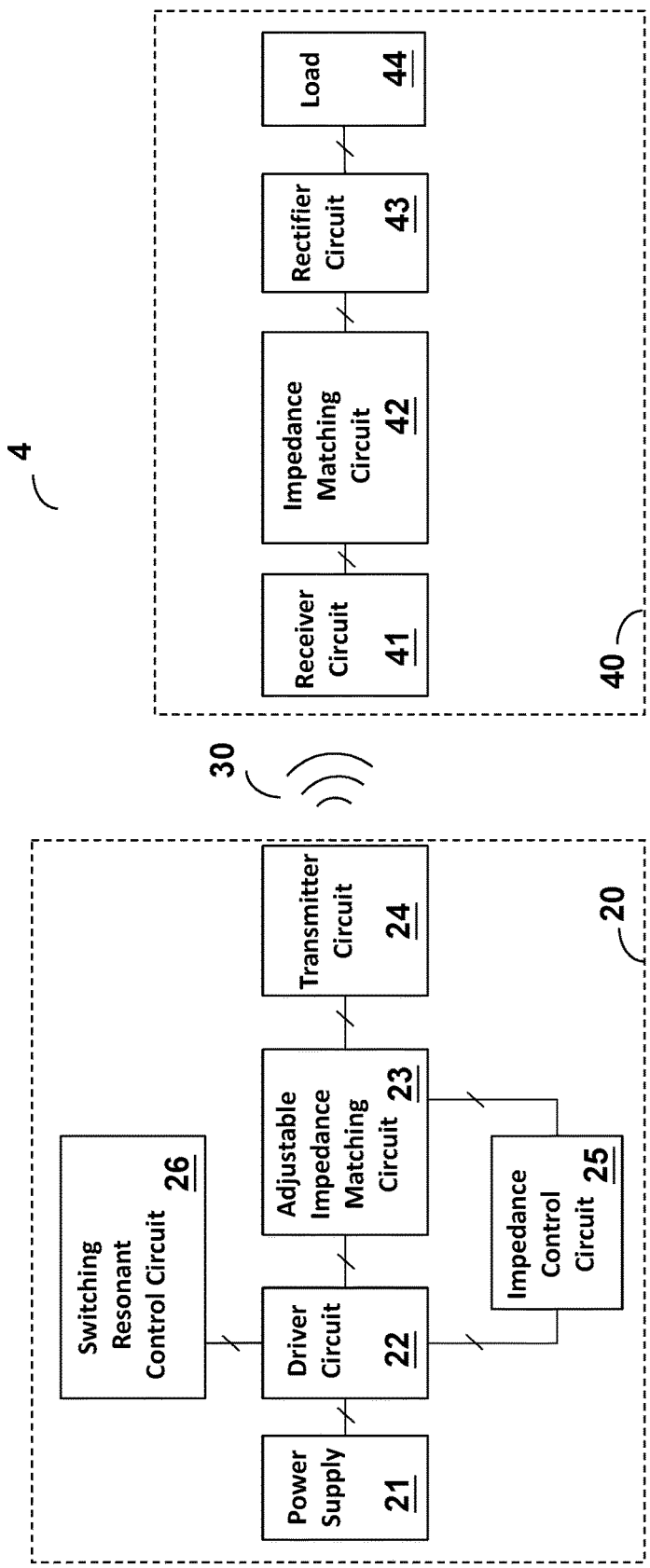
FIG. 4 shows a block diagram of an embodiment of the resonant wireless power transmission system according to the present invention.

FIG. 4 shows one embodiment of the resonant wireless power transmission system according to the present invention; the resonant wireless power transmission system includes a resonant wireless power transmitter circuit 20 and a resonant wireless power receiver circuit 40.

The resonant wireless power transmitter circuit 20 shown in FIG. 4 comprises a driver circuit 22 coupled to a power supply 21; an adjustable impedance matching circuit 23 coupled to the driver circuit 22; a transmitter circuit coupled to the adjustable impedance matching circuit 23 and the driver circuit 22; an impedance control circuit 25, which is coupled to the adjustable impedance matching circuit 23 and the driver circuit 22, and is configured to adjust the adjustable impedance matching circuit 23; and a switching resonant control circuit 26 coupled to the driver circuit 22. The power supply 21 may be an external power supply (e.g. AC power supply) or an internal power supply (e.g. a battery) of the resonant wireless power transmitter circuit 20.

The resonant wireless power receiver circuit 40 includes a receiver circuit 41; an impedance matching circuit 42 coupled to the receiver circuit 41; a rectifier circuit 43 coupled to the impedance matching circuit 42; and a load 44 coupled to the rectifier circuit 43.

The wireless power transmission is achieved as thus. The resonant wireless power transmitter circuit in FIG. 4 converts the power supplied by the DC or AC power supply 21 to a resonant frequency and transmit the power to a wireless field 30 (for example but not limited to a magnetic field, an electric field or an electromagnetic field) through the resonant effect by the cooperation of the adjustable impedance matching circuit 23 and the transmitter circuit 24. The wireless power transmitted to the wireless field 30 is received by the resonant wireless power receiver circuit 40 through for example but not limited to coupling, induced by, or capturing the wireless power in the wireless field 30. The wireless power received is rectified by the rectifier circuit 43 and supplied to the load 44.

Since the operation of the resonant wireless power transmission system 4 shown in FIG. 4 is based on resonance effect, if the resonant frequency generated by the switching resonant control circuit 26 drifts from the preset frequency, or if there is dislocation of the receiver circuit, or if there are multiple resonant wireless power receiver circuits coupled to receive the wireless power at the same time, off resonance could happen. If the off resonance is not corrected or controlled, it could cause power loss. If off resonance happens in the resonant wireless power transmitter circuit 4, the current of the reactive components in the resonant circuit (for example but not limited to the transmitter coil of the transmitter circuit 24, or the impedance matching capacitor of the adjustable impedance matching circuit 23) will lead (have an earlier phase) or lag (have a later phase) with respect to the voltage thereof. That is, there is a phase difference between the current and the voltage of the resonant reactive components and the actual power transmitted will decrease.

Figure 5:
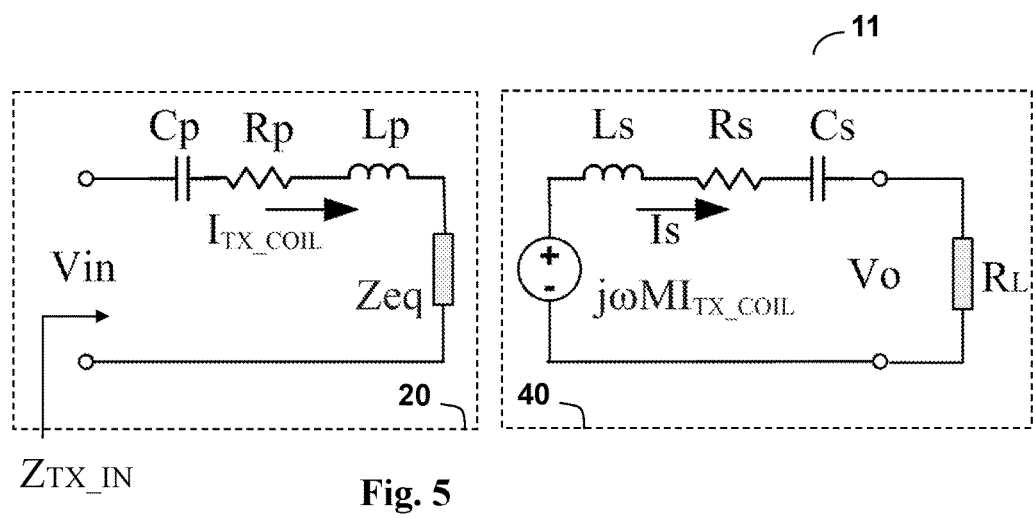
FIG. 5 shows a schematic diagram of the equivalent circuit of a resonant wireless power receiver circuit coupling to the resonant wireless power transmitter circuit according to the present invention.

FIG. 5 shows an equivalent circuit (equivalent circuit 11) of the aforementioned resonant wireless power transmitter circuit coupling to the resonant wireless power receiver circuit. The resonant wireless power transmitter circuit 20 includes a transmitter coil which has an inductance Lp; Rp which stands for the parasitic resistance of the transmitter circuit 20; and Cp which is an impedance matching capacitor. The resonant wireless power receiver circuit 40 includes a receiver coil which has an inductance Ls; Rs which stands for the parasitic resistance of the receiver circuit 40; and Cs which is an impedance matching capacitor; wherein RL is an equivalent load resistance.

Zeq is the reflection impedance of the transmitter side which is coupled from the receiver side and it can be shown as the equation below:

$$Z_{eq} = \frac{\omega^2 k^2 L_p L_s}{R_s + j\omega L_s - j\frac{1}{\omega C_s} + R_L}$$

wherein $\omega$ is the operating frequency in rad and k is the coupling factor between the transmitter coil and the receiver coil.

ZTX_IN is the equivalent input impedance of the transmitter side, which includes the equivalent inductor Lp, the equivalent resistor Rp, the impedance matching capacitor Cp, and the reflection impedance of the transmitter side which is coupled from the receiver side, Zeq. ZTX_IN can be shown as the equation below:

$$Z_{TX\_IN} = R_p + j\omega L_p - j\frac{1}{\omega C_p} + \frac{\omega^2 k^2 L_p L_s}{R_s + j\omega L_s - j\frac{1}{\omega C_s} + R_L}$$

The current of the transmitter coil operating under the input voltage Vin can be shown as the equation below:

$$I_{TX\_COIL} = \frac{V_{in}}{R_p + j\omega L_p - j\frac{1}{\omega C_p} + Z_{eq}}$$

Hence, the input power can be expressed as:

$$P_{IN} = Re\{Z_{TX\_IN}\} \times I_{TX\_COIL}^2$$

When the input impedance of the resonant wireless power transmitter circuit 20 is matched, the imaginary part of the input impedance is zero and the resonant wireless power transmitter circuit 20 can generate the required transmission power and transmitter coil current under a relatively low input voltage.

If the input impedance of the resonant wireless power transmitter circuit 20 is not matched so that off resonance happens, the current of the reactive components in the resonant circuit (for example but not limited to the transmitter coil of the transmitter circuit 24, or the impedance matching capacitor of the adjustable impedance matching circuit 23 in FIG. 4) will lead (have an earlier phase) or lag (have a later phase) with respect to the voltage thereof. That is, there is a phase difference between the current and the voltage of the resonant reactive components and the actual power transmitted will decrease. For providing the same level of output power, the input voltage is required to be higher. Under this circumstance, the higher operating voltage and the current which is phase-shifted from the operating voltage will cause a larger power loss.

Figure 6:
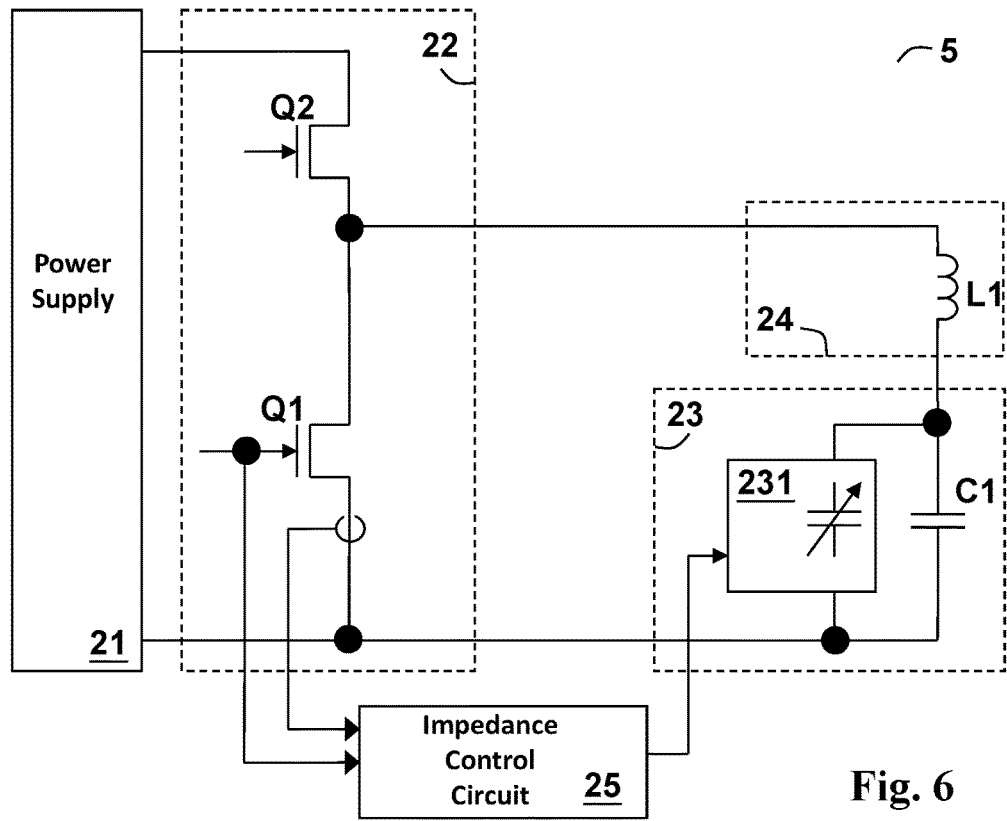
FIG. 6 shows one embodiment of the resonant wireless power transmitter circuit according to the present invention.

FIG. 6 shows one embodiment of the resonant wireless power transmitter circuit (resonant wireless power transmitter circuit 5) according to the present invention, wherein the resonant wireless power transmitter circuit 5 comprises a power supply 21; a driver circuit 22; an adjustable impedance matching circuit 23; a transmitter circuit 24 which includes a transmitter coil L1; and an impedance control circuit 25. The driver circuit 22 is for example but not limited to a half bridge driver circuit as shown in FIG. 6, which includes power switches Q1 and Q2 and operates at a pre-determined resonant frequency. The adjustable impedance matching circuit 23 includes an impedance matching capacitor C1 and a variable capacitor circuit 231, wherein the impedance control circuit 25 determines the phase difference between the current and the voltage of the resonant reactive components of the resonant wireless power receiver circuit 5 according to a switching time signal of a switch (for example but not limited to a switching time signal of the switch Q1) and a current related signal (for example but not limited to a current signal of the switch Q1), to generate an impedance control signal for controlling the variable capacitor circuit 231 to adjust the reactance of the adjustable impedance matching circuit 23, such that the input impedance of the resonant wireless power transmitter circuit 5 is matched under the pre-determined resonant frequency. The "pre-determined resonant frequency" as used in the specification of the present invention may be a fixed value or an adjustable variable.

Figure 7:
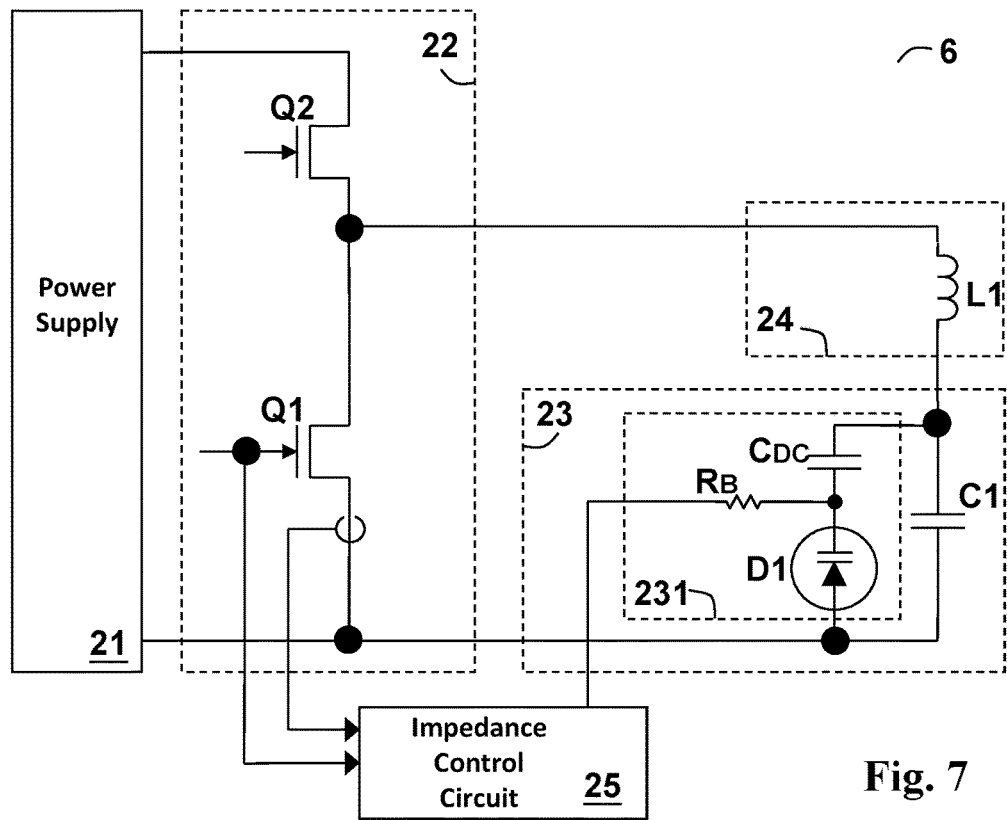
FIG. 7 shows one embodiment of the resonant wireless power transmitter circuit according to the present invention.

FIG. 7 shows one embodiment of the resonant wireless power transmitter circuit (resonant wireless power transmitter circuit 6), wherein the adjustable impedance matching circuit 23 includes an impedance matching capacitor C1 and a variable capacitor circuit 231; the variable capacitor circuit 231 includes a varactor D1, a DC bias resistor RB and a DC blocking capacitor CDC. In one embodiment, for example, the varactor D1 may be a voltage controlled varactor of which the capacitance and the reactance can be changed by applying different levels of reverse bias voltages. The impedance control circuit 25 generates an impedance control signal to control the capacitance of the varactor D1 and change its reactance, such that the input impedance of the resonant wireless power transmitter circuit 6 is matched at a pre-determined resonant frequency.

In FIGS. 6 and 7, the current related signal used by the impedance control circuit 25 for generating the impedance control signal is the current signal related to the switch Q1. However, this is only one embodiment. In other embodiments, it can be a current signal related to the switch Q2 or the transmitter coil, instead of the current related to the switch Q1. And, the switching time signal used by the impedance control circuit 25 for generating the impedance control signal is the gate control signal of the switch Q1. Similarly, this is only one embodiment. In other embodiments, it can be a switching time signal related to the switch Q2 instead of the switching time signal related to the switch Q1, and the switching time signal is not limited to a gate control signal of the switch, but can be any related signal which carries information of the switching time, for example but not limited to a VDS (drain-source voltage) of the switch Q1 or Q2.

The phase difference between the current and the voltage of the resonant reactive components of the resonant wireless power transmitter circuits 5 and 6 in FIGS. 6 and 7 can be determined by other ways, not limited to being based on the switching time signal and the current related signal.

Figure 8A:
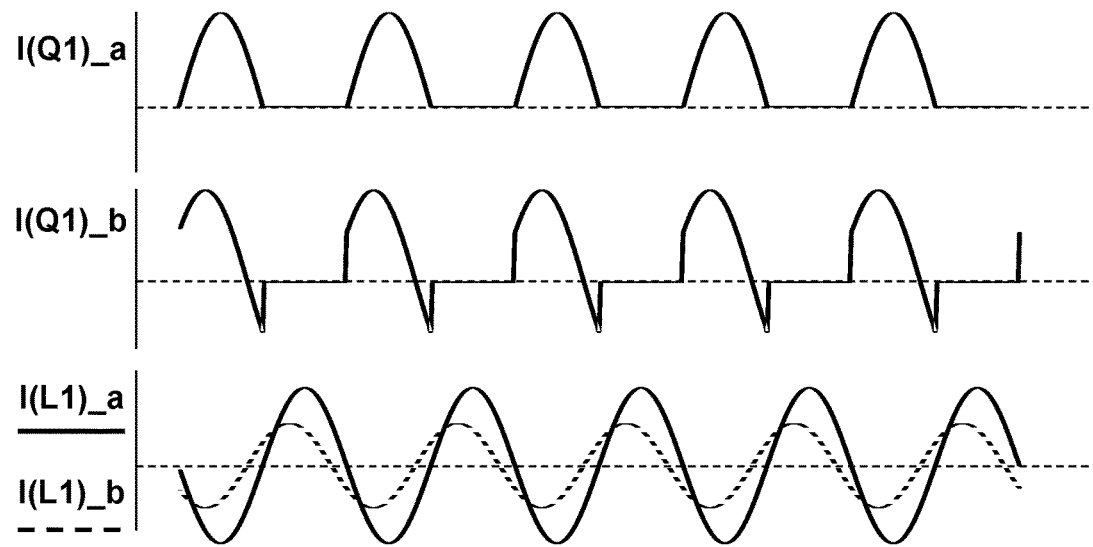
FIGS. 8A and 8B show simulation waveforms of the circuit shown in FIG. 7.

FIG. 8A shows waveforms corresponding to the resonant wireless transmitter circuits 5 and 6 in FIGS. 6 and 7. As an example, when the off resonance is caused by the impedance not-matching due to the reflection drift from the receiver side, with the same input power, I(Q1)_a and I(Q1)_b are currents of the switch Q1 under matched impedance and under not-matched impedance respectively, and I(L1)_a and I(L1)_b are currents of the transmitter coil L1 under matched impedance and under not-matched impedance respectively. The current through the switch Q1 of the resonant wireless transmitter circuits 5 and 6 in FIGS. 6 and 7, when the switch Q1 is conductive, is the current of the positive half cycle of the resonant sinewave. When the impedance is matched, as shown by I(Q1)_a, the current of the switch Q1 has a waveform which is very close to a perfect semi-sinusoidal waveform (positive half cycle of the resonant sinewave). On the other hand, if the impedance is not matched, there will be a phase difference between the current and the voltage of the resonant reactive components in the resonant wireless transmitter circuits 5 and 6, and hence, as shown by I(Q1)_b, the current of the switch Q1 has an imperfect semi-sinusoidal waveform which is off-phase, that is, apart of the upper half sinewave at the leading edge is missing and there is an extra part of the lower half sinewave, which means a current toward an opposite direction (negative direction current). That is, a part of the current which originally should be flowing toward a direction (positive direction current) for power transmission flows toward the opposite direction (the negative direction current) to deteriorate the efficiency of the power transmission.

Figure 8B:
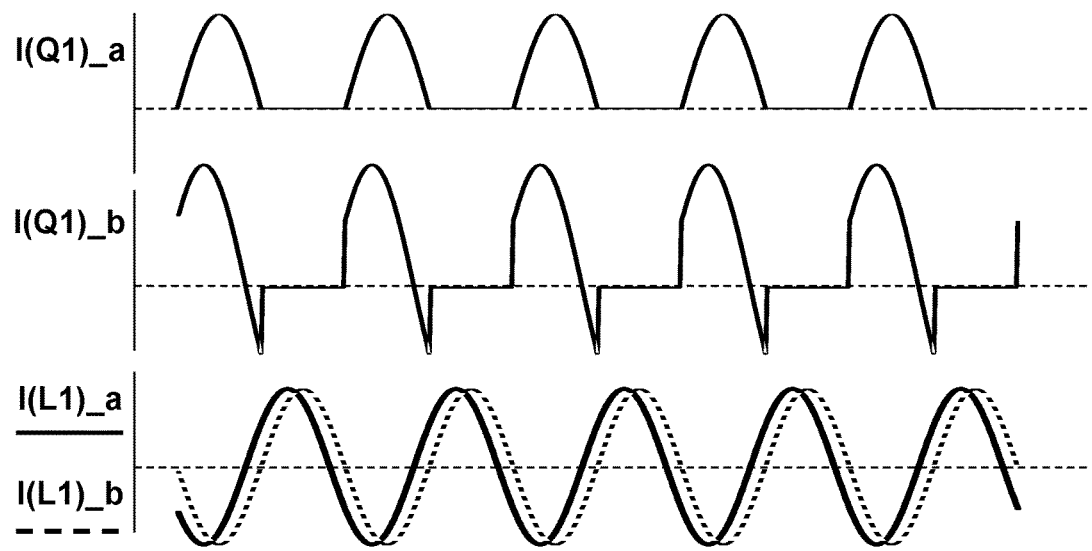

In addition, as shown in FIG. 8A, with the same input power, the transmitter coil current I(L1)_b (dashed line) under not-matched impedance is smaller than the transmitter coil current I(L1)_a (solid line) under matched impedance, and there is a phase difference between these two currents. As shown in FIG. 8B, it requires a larger current of the power switch Q1 (i.e. I(Q1)_b>I(Q1)_a) for the current of transmitter coil L1 to be the same (i.e. I(L1)_a≈I(L1)_b). The above explains that when the input impedance is not matched, the resonant wireless power transmitter circuits 5 and 6 will have larger power loss and lower power transmission efficiency.

Figure 9A:
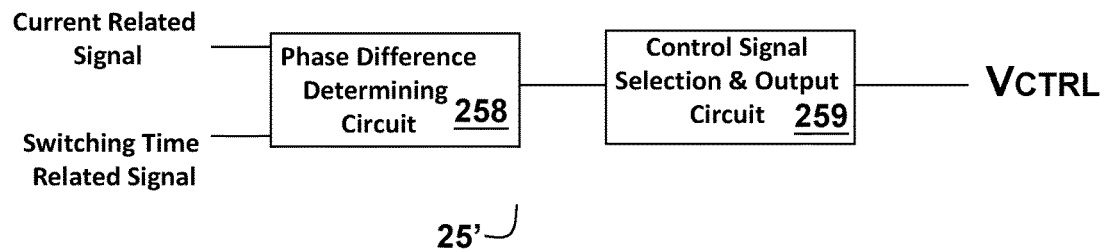
FIGS. 9A-9C show embodiments of the impedance control circuit and negative direction current detection circuit thereof according to the present invention.

FIG. 9A shows one embodiment of the impedance control circuit (impedance control circuit 25') according to the present invention, which includes a phase difference determining circuit 258 and a control signal selection and output circuit 259. The phase difference determining circuit 258 determines the phase difference between a current related signal (For example, in the embodiments of FIGS. 6 and 7, the current related signal may be a signal related to the current of the switch Q1, but may also be a signal related to the current of the switch Q2 or the transmitter coil current) and a switching time related signal (For example, in the embodiments of FIGS. 6 and 7, the switching time related signal may be a switching time signal related to the switch Q1 or the switch Q2, e.g. a gate control signal or a drain-source voltage signal thereof). And, the control signal selection and output circuit 259 selects and outputs the impedance control signal VCTRL according to the determination result from the phase difference determining circuit 258. The impedance control signal VCTRL may be an analog signal or a digital signal. In a preferred embodiment, VCTRL is an analog signal.

Figure 9B:
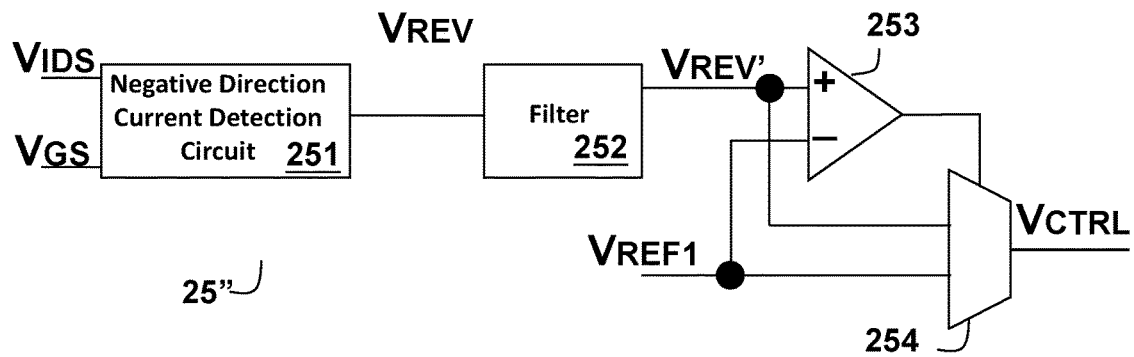

FIG. 9B is one specific embodiment of the impedance control circuit according to the present invention (impedance control circuit 25"). The impedance control circuit 25" includes a negative direction current detection circuit 251, a filter 252, a comparator 253 and a multiplexer 254, wherein the negative direction current detection circuit 251 receives a switching time signal (for example but not limited to the gate control signal VGS of the switch Q1 in the embodiments of FIGS. 6 and 7 and a current related signal (for example but not limited to a current sensed signal VIDS of the switch Q1, which indicates the current through the switch Q1) to generate a negative direction current pulse VREV. The filter 252 generates a filtered negative direction current pulse VREV' by filtering the negative direction current pulse VREV. The comparator 253 compares the filtered negative direction current pulse VREV' and a reference voltage VREF1. The multiplexer 254 selects the filtered negative direction current pulse VREV' or a reference voltage VREF1 as the impedance control signal VCTRL. In this embodiment, the negative direction current detection circuit 251 corresponds to the aforementioned phase difference determining circuit 258, whereas the filter 252, the comparator 253 and the multiplexer 254 correspond to the aforementioned control signal selection and output circuit 259.

In the aforementioned embodiment, the reference voltage VREF1 is used as an input of the comparator 253 (i.e. a signal to be compared with the filtered negative direction current VREV') and also as one of the candidates to be selected by the multiplexer 254. In another embodiment, another reference voltage (not shown) may be used to replace the reference voltage VREF1 as one of the candidates to be selected by the multiplexer 254, i.e., the comparator 253 compares the filtered negative direction current pulse VREV' and the reference voltage VREF1, and selects the filtered negative direction current pulse VREV' or the aforementioned other reference voltage (not shown) as the impedance control signal VCTRL.

Figure 9C:
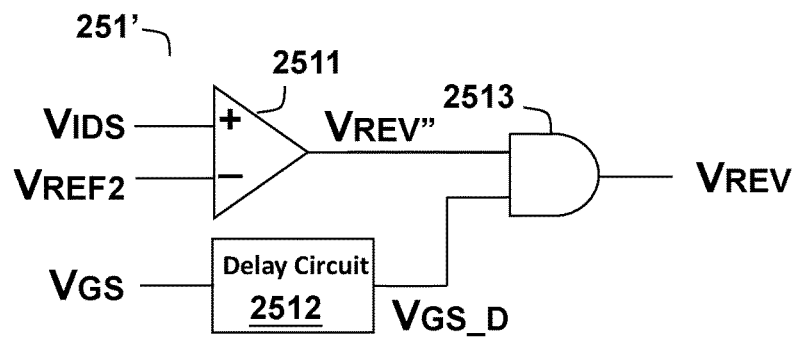

Please refer to FIG. 9C, which shows one embodiment of the negative direction current detection circuit 251' according to the present invention. The negative direction current detection circuit 251' includes a comparator 2511, a delay circuit 2512, and a logic circuit 2513. The comparator 2511 compares a current related signal VIDS and a reference voltage VREF2 to generate a negative direction current signal VREV". The delay circuit 2512 delays the aforementioned switching time signal VGS of the power switch to generate a delayed switching time signal VGS_D. The logic circuit 2513 uses the delayed switching time signal VGS_D to mask the negative direction current signal VREV", to generate a negative direction current pulse VREV.

Note that there are various embodiments of the impedance control circuit and the embodiment shown in 9B is only one of them. In one embodiment as an example, a mapping circuit (not shown) may replace the filer 252, the comparator 253 and the multiplexer 254 to generate an output signal by mapping the input signal.

Figure 10:
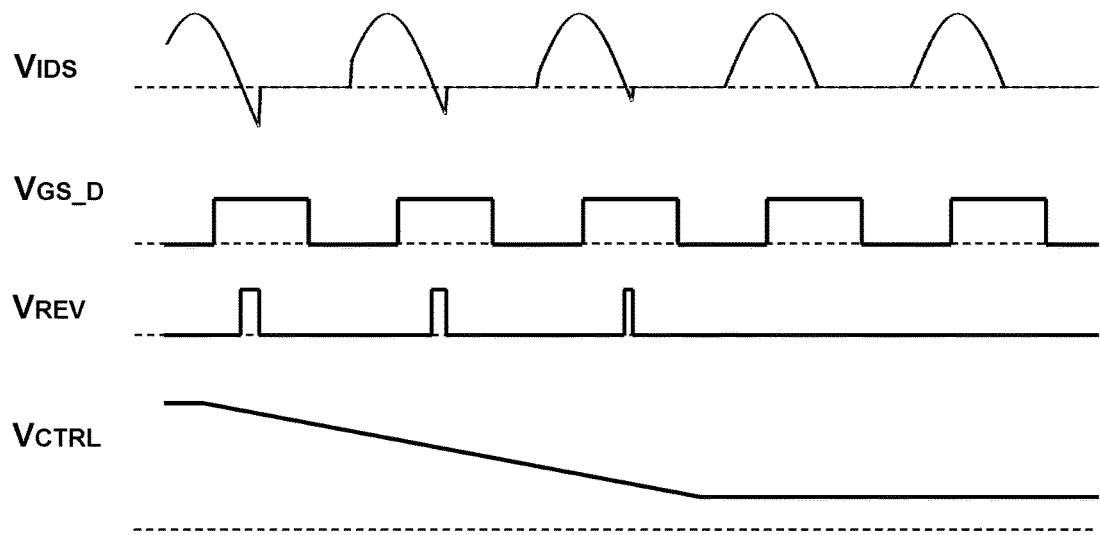
FIG. 10 shows simulation waveforms of the circuits shown in FIGS. 9B and 9C.

FIG. 10 shows waveforms of the circuits in FIGS. 6, 7, 9B, and 9C. Under for example but not limited to the off resonance condition caused by the impedance not-matching due to the reflection drift from the receiver side, in the beginning, because the impedance is not matched, VIDS (i.e. a current related signal of current I(Q1) of the switch Q1) presents an imperfect semi-sinusoidal waveform with a phase difference (i.e. a part of the upper half sinewave at the leading edge is missing and there is an extra part of the lower half sinewave, which means a negative direction current). The signal VIDS is masked by the delayed switching time signal VGS_D whereby a negative direction current pulse VREV is generate. And the impedance control circuit 25 as shown in FIGS. 6, 7, 9A, and 9B generates the impedance control signal VCTRL according to the negative direction current pulse VREV. The adjustable impedance matching circuit 23 adjusts the capacitance of the varactor, and hence the reactance of the adjustable impedance matching circuit 23 and the impedance of the resonant wireless power transmitter circuit are thereby adjusted. As shown by the above, a negative feedback loop is formed such that the input impedance of the resonant wireless power transmitter circuit can be adjusted to be matched automatically, continuously, and in analog form, as the wireless power is being transmitted. Hence, as shown in FIG. 10, the impedance control signal VCTRL is automatically adjusted such that the current through the power switch, as indicated by the signal VIDS, gradually becomes a perfect semi-sinusoidal waveform without any phase difference and the negative direction current pulse VREV gradually becomes silent. This means that the resonant wireless power transmitter circuit originally in off resonance state has adjusted itself to a preferred resonant state automatically. That is, the input impedance of the resonant wireless power transmitter circuit is automatically adjusted, continuously and in analog form, to be matched as the wireless power is being transmitted. The phase difference between the current and the voltage of the resonant reactive components (for example but not limited to the transmitter coil) approaches zero so that the resonant wireless power transmitter circuit has a much higher transmission efficiency and a much lower power loss.

In the aforementioned example of automatic adjustment of the impedance matching, the root cause of impedance not-matching is the reflection drift from the receiver side, which is only an illustrative example. Because the adjustment of the impedance in the present invention is not simply based on detecting an amount of the a system current or a change of the system current, but based on signals related to the phase difference between the current and the voltage (for example but not limited to a switching time related signal and a current related signal of a switch) of the resonant reactive components (for example but not limited to the transmitter coil and/or the impedance matching capacitor) of the resonant wireless power transmitter circuit, hence, for a different root cause to cause off resonance such as but not limited to an operation error in an oscillator (not shown) of the switching resonant control circuit 26 as shown in FIG. 4, the present invention can still be applied to automatically adjust the resonant wireless power transmitter circuit to a preferred resonant state The aforementioned adjustable impedance matching circuit 23 is not limited to the example in FIG. 6. FIG. 11A-11D show various other embodiments of the adjustable impedance matching circuit and the transmitter circuit according to the present invention, wherein the transmitter circuit 24 is for example a single transmitter coil, and the variable capacitor circuit 231 of the adjustable impedance matching circuit 23 may be coupled to the transmitter circuit 24 in parallel, in series or in combinations of parallel and series.

Figure 11A:
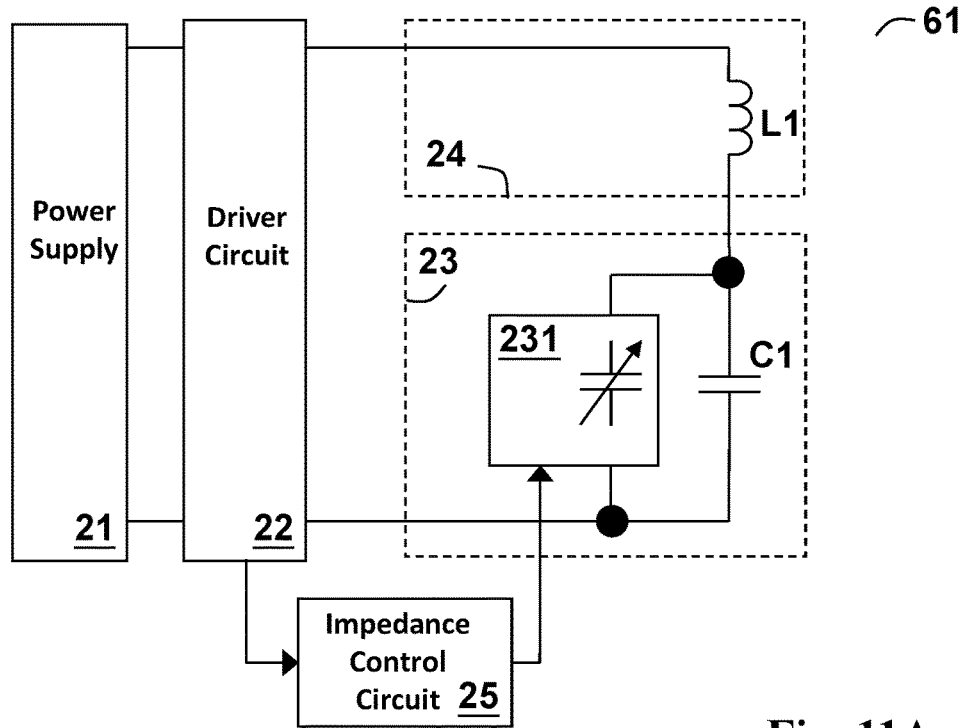
FIGS. 11A-11D and 12A-12C show several embodiments of the resonant wireless power transmitter circuit according to the present invention.

In FIG. 11A, the adjustable impedance matching circuit 23 is coupled to the transmitter circuit 24 in series, wherein the adjustable impedance matching circuit 23 includes a variable capacitor circuit 231 and an impedance matching capacitor C1, wherein the variable capacitor circuit 231 and the impedance matching capacitor C1 are coupled in parallel.

Figure 11B:
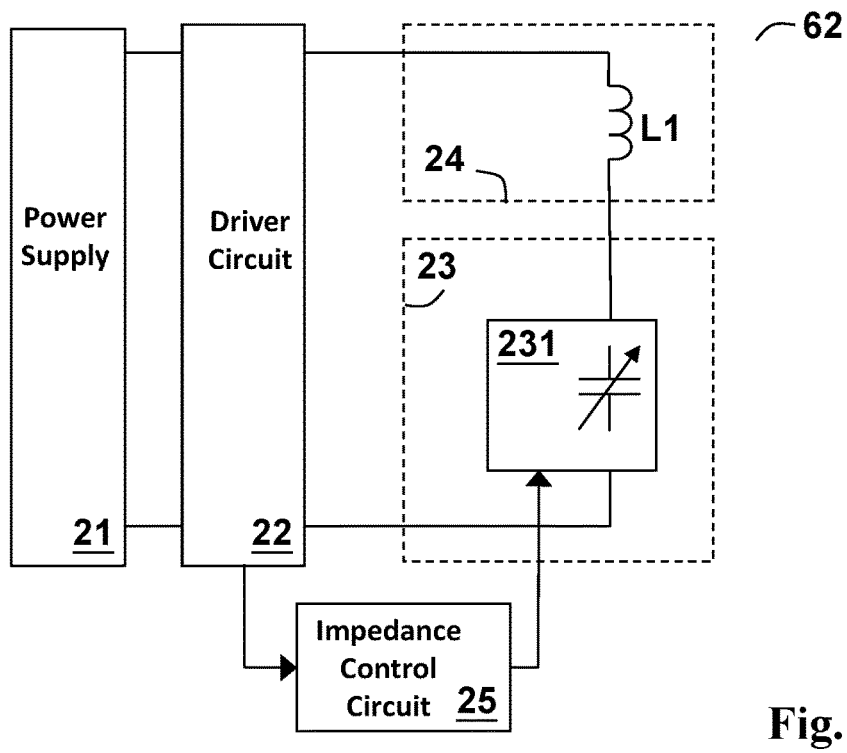

In FIG. 11B, the adjustable impedance matching circuit 23 is coupled to the transmitter circuit 24 in series, wherein the adjustable impedance matching circuit 23 includes a variable capacitor circuit 231.

Figure 11C:
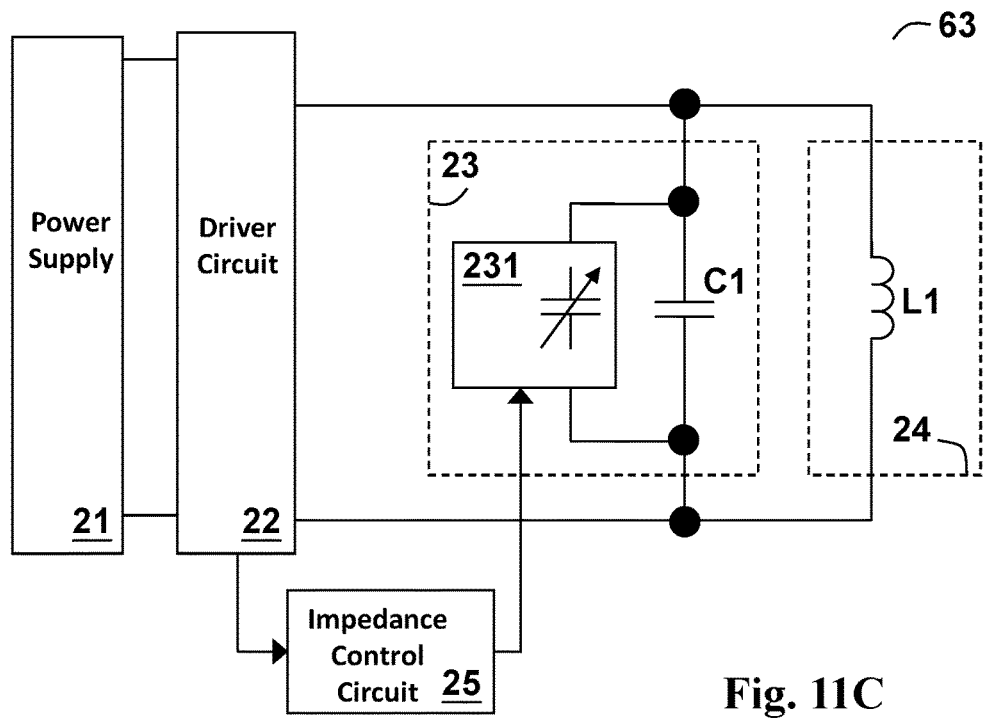

In FIG. 11C, the adjustable impedance matching circuit 23 is coupled to the transmitter circuit 24 in parallel, wherein the adjustable impedance matching circuit 23 includes a variable capacitor circuit 231 and an impedance matching capacitor C1, wherein the variable capacitor circuit 231 and the impedance matching capacitor C1 are coupled in parallel.

Figure 11D:
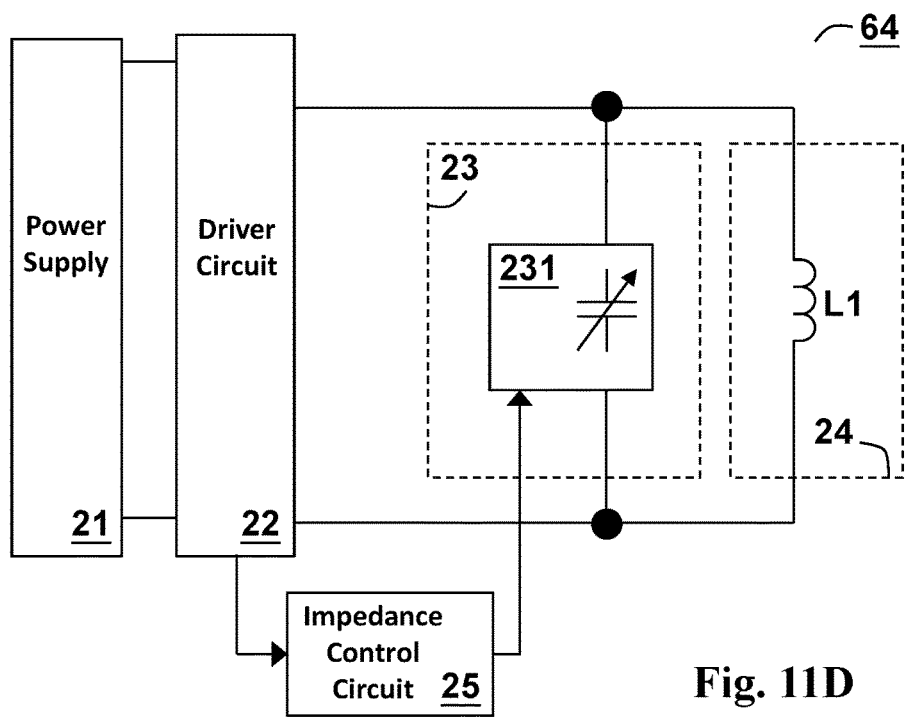

In FIG. 11D, the adjustable impedance matching circuit 23 is coupled to the transmitter circuit 24 in parallel, wherein the adjustable impedance matching circuit 23 includes a variable capacitor circuit 231.

Figure 12A:
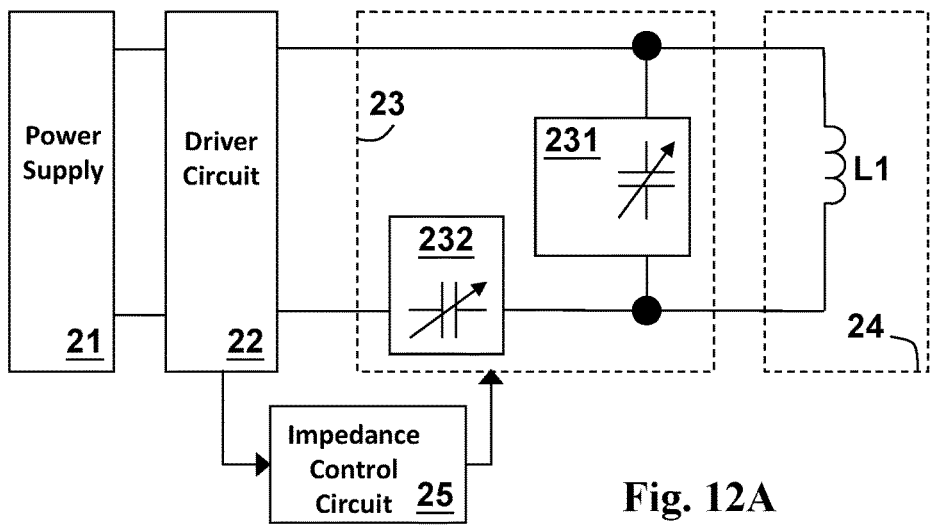

In FIG. 12A, the adjustable impedance matching circuit 23 is coupled to the transmitter circuit 24 in a combination of parallel and series, wherein the adjustable impedance matching circuit 23 includes variable capacitor circuits 231 and 232.

Figure 12B:
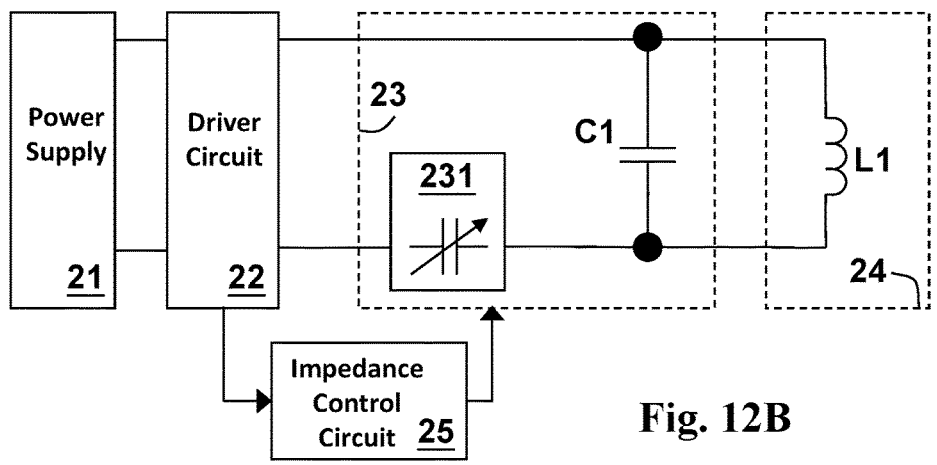

In FIG. 12B, the adjustable impedance matching circuit 23 is coupled to the transmitter circuit 24 in a combination of parallel and series, wherein the adjustable impedance matching circuit 23 includes a variable capacitor circuit 231 and an impedance matching capacitor C1, wherein the transmitter circuit 24 and the impedance matching capacitor C1 are coupled in parallel.

Figure 12C:
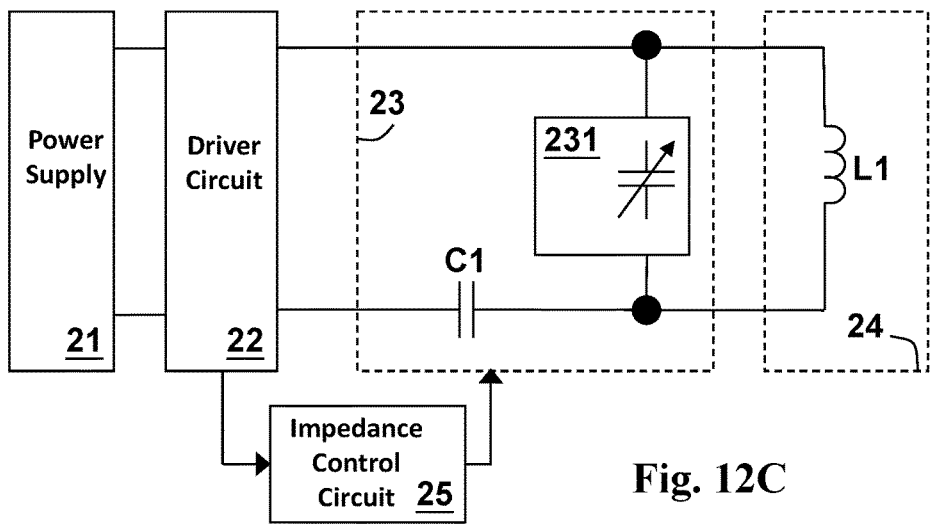

In FIG. 12C, the adjustable impedance matching circuit 23 is coupled to the transmitter circuit 24 in a combination of parallel and series, wherein the adjustable impedance matching circuit 23 includes a variable capacitor circuit 231 and an impedance matching capacitor C1, wherein the transmitter circuit 24 and the variable capacitor circuit 231 are coupled in parallel.

The aforementioned various possible combinations of the adjustable impedance matching circuit 23 and the transmitter circuit 24 are only for illustration purpose but not for limiting the scope of the present invention.

In one embodiment, for example, the varactor (e.g. D1 in FIG. 13A-13D) may be a voltage controlled varactor of which the capacitance can be adjusted by applying different levels of reverse bias voltage. Since the aforementioned voltage controlled varactor requires DC bias for operation and control, the variable capacitor circuit containing such varactor(s) may include DC bias resistor(s) or DC blocking capacitor(s) in for example but not limited to the following forms, depending on the actual application conditions.

Figure 13A:
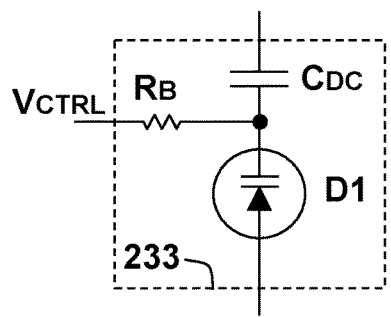
FIG. 13A-13D show several embodiments of the variable capacitor circuit of the resonant wireless power transmitter circuit according to the present invention.

In FIG. 13A, the variable capacitor circuit 233 includes a varactor D1, a DC bias resistor RB and a DC blocking capacitor CDC.

Figure 13B:
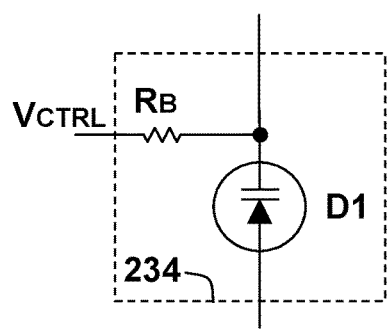

In FIG. 13B, the variable capacitor circuit 234 includes a varactor D1 and a DC bias resistor RB.

Figure 13C:
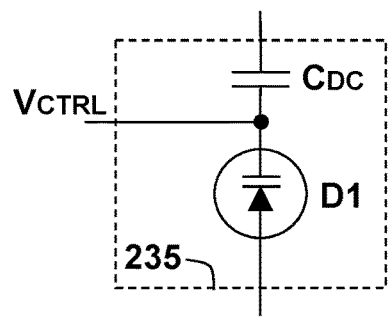

In FIG. 13C, the variable capacitor circuit 235 includes a varactor D1 and a DC blocking capacitor CDC.

Figure 13D:
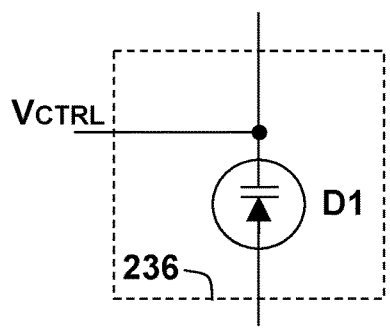

In FIG. 13D, the variable capacitor circuit 236 includes a varactor D1.

Figure 14:
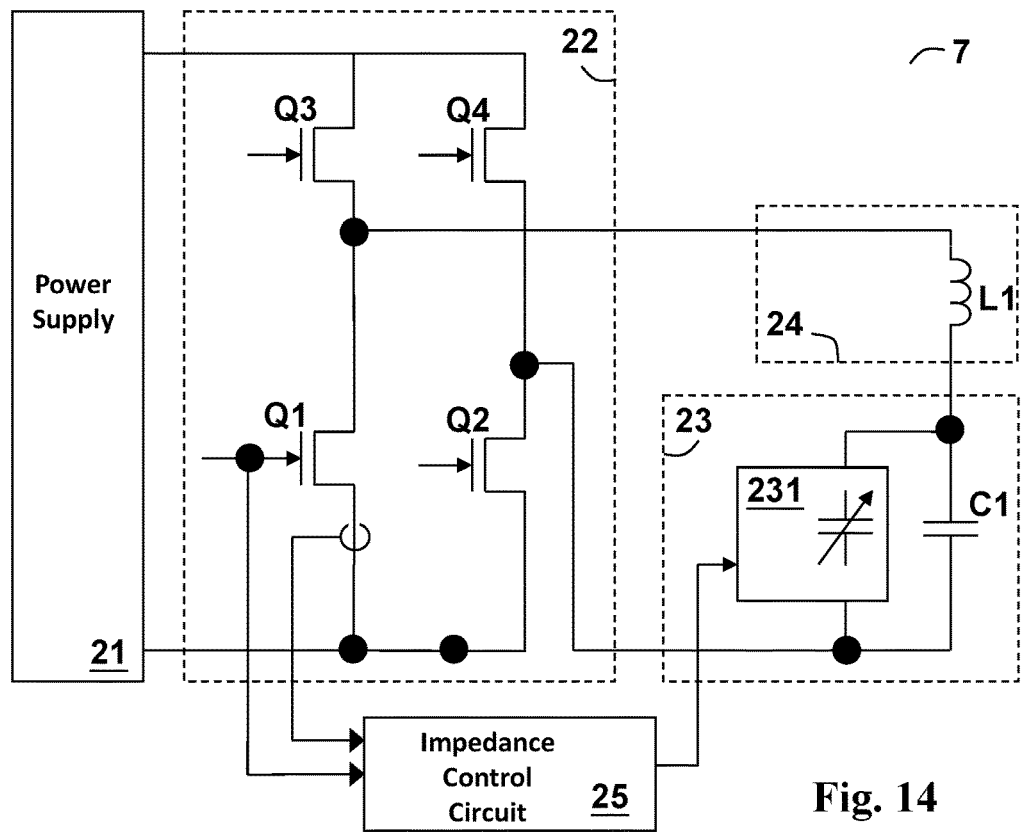
FIG. 14-16 show several embodiments of the resonant wireless power transmitter circuit according to the present invention.
Figure 15:
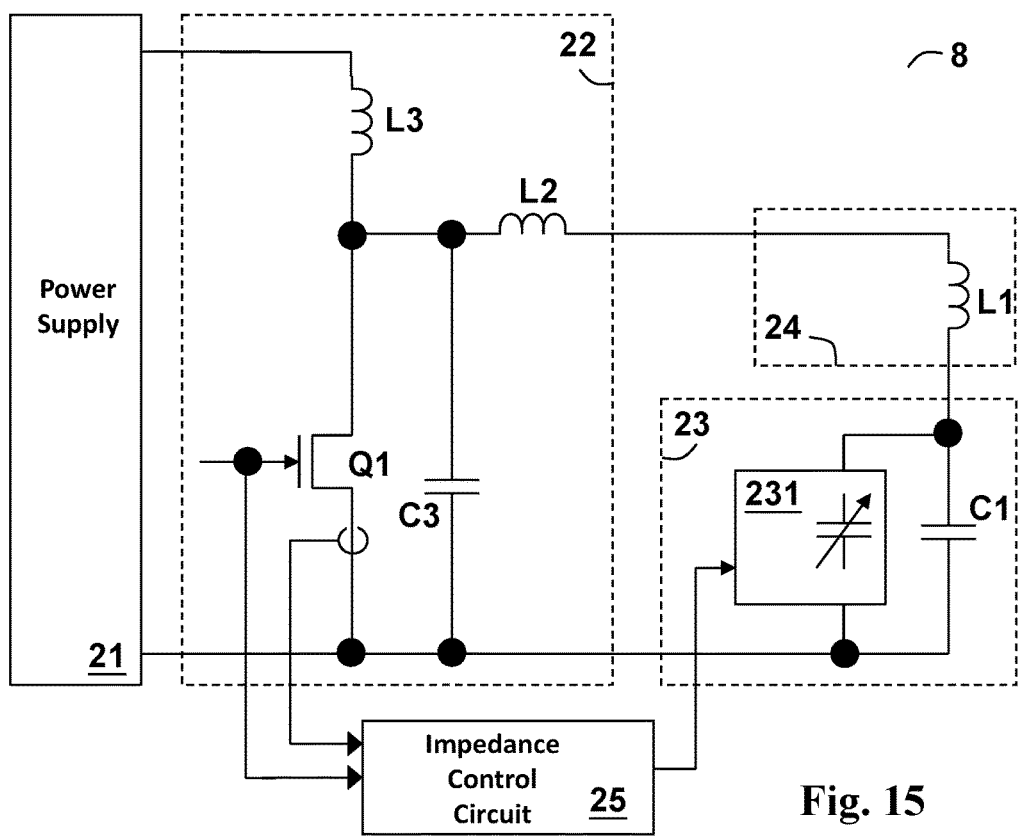
Figure 16:
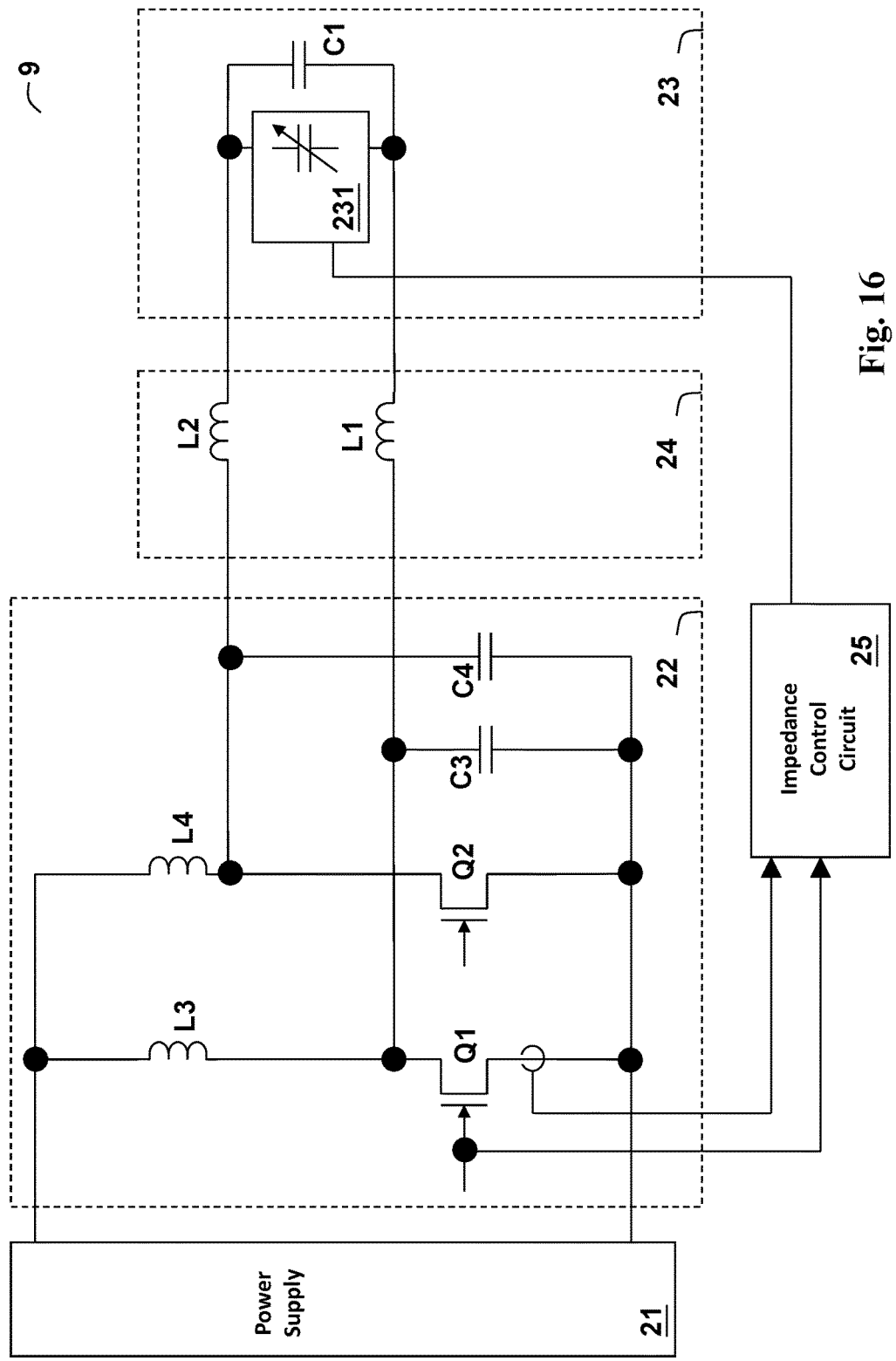

Instead of the half bridge driver circuit 22 shown in FIGS. 6 and 7, the driver circuit 22 of the resonant wireless power transmitter circuit 20 in FIG. 4 may be for example but not limited to the driver circuits shown in FIGS. 14-16. In FIG. 14, the driver circuit 22 is a full bridge driver circuit which includes four power switches Q1, Q2, Q3, and Q4. The half loop circuit formed by the transmitter circuit 24 and the adjustable impedance circuit 23 are connected to the node between Q1 and Q3 and the node between Q2 and Q4. In FIG. 15, the driver circuit 22 is a class E power amplifier which includes a power switch Q1, inductors L2 and L3, and a capacitor C3. In FIG. 16, the driver circuit 22 is a differential class E power amplifier which includes two symmetrical class E power amplifiers, including two power switches Q1 and Q2, two inductors L3 and L4, and two capacitors C3 and C4, and the transmitter circuit 24 includes two symmetrical transmitter coils L1 and L2.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A resonant wireless power transmitter circuit having an input impedance, comprising:
   a driver circuit, which is coupled to a power supply, wherein the driver circuit includes at least a power switch which is controlled by a switching time signal to switch at a pre-determined resonant frequency;
   a switching resonant control circuit, which is coupled to the driver circuit, and configured to control the driver circuit such that the driver circuit operates at the pre-determined resonant frequency;
   an adjustable impedance matching circuit, which is coupled to the driver circuit, wherein the adjustable impedance matching circuit includes at least one varactor, and has an impedance;
   a transmitter circuit, which is coupled to the adjustable impedance matching circuit and the driver circuit, wherein the transmitter circuit includes at least a transmitter coil, wherein the power switch of the driver circuit is configured to switch with the resonant frequency to periodically conduct the power supply to drive the transmitter coil; and
   an impedance control circuit, which is coupled to the driver circuit and the adjustable impedance matching circuit, and configured to operably generate an analog impedance control signal to control a reactance of the varactor in continuous analog form so as to control the impedance of the adjustable impedance matching circuit such that the input impedance of the resonant wireless power transmitter circuit is matched at the pre-determined frequency, wherein the reactance of the varactor is continuously adjustable in analog form;
   wherein when the input impedance of the resonant wireless power transmitter circuit is matched at the pre-determined frequency, a current of the power switch supplies a half cycle of a resonant sinewave current, wherein the resonant sinewave current flows through the transmitter coil;
   wherein the impedance control circuit is configured to operably generate the impedance control signal according to the switching time signal of the power switch and a signal related to the current of the power switch, wherein the switching time signal carries information of the switching time point of the power switch.

2. The resonant wireless power transmitter circuit of claim 1, wherein the adjustable impedance matching circuit includes one of the following combinations (A) and (B):

(A) wherein the adjustable impedance matching circuit includes plural varactors, and the plural varactors are connected in parallel, in series, or in combination of parallel and series; and (B) wherein the adjustable impedance matching circuit includes at least one varactor and at least one capacitor, and the at least one varactor and the at least one capacitor are connected in parallel, in series, or in combination of parallel and series.

3. The resonant wireless power transmitter circuit of claim 1, wherein the impedance control circuit is configured to operably generate the impedance control signal according to a phase difference between the switching time signal of the power switch and the signal related to the current of the power switch.

4. The resonant wireless power transmitter circuit of claim 1, wherein the impedance control circuit is configured to operably generate the impedance control signal according to a signal related to a negative direction current of the power switch, wherein the negative direction current of the power switch flows in a direction which is opposite to a first direction in which the current of the power switch flows when the input impedance of the resonant wireless power transmitter circuit is matched at the pre-determined frequency, wherein the signal related to the negative direction current is determined according to the switching time signal of the power switch and the current of the power switch.

5. The resonant wireless power transmitter circuit of claim 1, wherein the impedance control circuit includes:
a negative direction current detection circuit, including:
a first comparator, which is configured to operably compare the current of the power switch and a first reference voltage to generate a negative direction current signal;
a delay circuit, which is configured to operably delay the switching time signal of the power switch to generate a delayed switching time signal;
a logic circuit, which is configured to operably mask the negative direction current signal by the delayed switching time signal to generate a negative direction current pulse; and
a filter, which is configured to operably filter the negative direction current pulse to generate a filter output signal, as a candidate of the impedance control signal, wherein the filter output signal is in a continuous analog form.

6. The resonant wireless power transmitter circuit of claim 5, wherein the impedance control circuit further comprises:
a second comparator, which is configured to operably compare the filter output signal and a second reference voltage to generate a selection signal; and
a multiplexer, which is configured to operably select the filter output signal or the second reference voltage to be the impedance control signal, or select the filter output signal or a third reference voltage to be the impedance control signal.

7. The resonant wireless power transmitter circuit of claim 1, wherein:
(A) the transmitter coil and the varactor are connected in parallel, in series, or in combination of parallel and series; or
(B) the transmitter coil and the varactor and at least one capacitor are connected in parallel, in series, or in combination of parallel and series.

8. The resonant wireless power transmitter circuit of claim 1, wherein the driver circuit is in one of the following forms: a half bridge driver circuit or a full bridge driver circuit or a class E driver circuit.

9. The resonant wireless power transmitter circuit of claim 1, wherein the driver circuit is configured to be in the form of a differential class E driver circuit;
wherein the driver circuit includes a first transmitter coil and a second transmitter coil connected in series, and wherein:
(A) each of the first transmitter coil and the second transmitter coil is connected with the varactor in parallel, in series, or in combination of parallel and series; or
(B) each of the first transmitter coil and the second transmitter coil is connected with the varactor and at least one capacitor in parallel, in series, or in combination of parallel and series.

10. A method for controlling a resonant wireless power transmitter circuit which has an input impedance, wherein the resonant wireless power transmitter circuit comprises: a driver circuit, which is coupled to a power supply, wherein the driver circuit includes at least a power switch which is controlled by a switching time signal to switch at a pre-determined resonant frequency; a switching resonant control circuit, which is coupled to the driver circuit, and configured to control the driver circuit such that the driver circuit operates at the pre-determined resonant frequency; and an adjustable impedance matching circuit, which is coupled to the driver circuit, wherein the adjustable impedance matching circuit includes at least one varactor, and has an impedance; and a transmitter circuit, which is coupled to the adjustable impedance matching circuit and the driver circuit, wherein the transmitter circuit includes at least a transmitter coil, wherein the power switch of the driver circuit is configured to switch with the resonant frequency to periodically conduct the power supply to drive the transmitter coil; the control method comprising:
generating an analog impedance control signal; and
controlling a reactance of the varactor in continuous analog form according to the analog impedance control signal so as to control the impedance of the adjustable impedance matching circuit such that the input impedance of the resonant wireless power transmitter circuit is matched at the pre-determined frequency, wherein the reactance of the varactor is continuously adjustable in analog form;
wherein when the input impedance of the resonant wireless power transmitter circuit is matched at the pre-determined frequency, a current of the power switch supplies a half cycle of a resonant sinewave current, wherein the resonant sinewave current flows through the transmitter coil;
wherein the impedance control signal is generated according to the switching time signal of the power switch and a signal related to the current of the power switch, wherein the switching time signal carries information of the switching time point of the power switch.

11. The method for controlling a resonant wireless power transmitter circuit of claim 10, wherein the adjustable impedance matching circuit includes one of the following combinations (A) and (B):
(A) wherein the adjustable impedance matching circuit includes plural varactors, and the plural varactors are connected in parallel, in series, or in combination of parallel and series; and
(B) wherein the adjustable impedance matching circuit includes at least one varactor and at least one capacitor, and the at least one varactor and the at least one capacitor are connected in parallel, in series, or in combination of parallel and series.

12. The method for controlling a resonant wireless power transmitter circuit of claim 10, wherein the step of generating the impedance control signal includes:
generating the impedance control signal according to a phase difference between the switching time signal of the power switch and the signal related to the current of the power switch.

13. The method for controlling a resonant wireless power transmitter circuit of claim 10, wherein the step of generating the impedance control signal includes:
generating the impedance control signal according to a signal related to a negative direction current of the power switch, wherein the negative direction current of the power switch flows in a direction which is opposite to a first direction in which the current of the power switch flows when the input impedance of the resonant wireless power transmitter circuit is matched at the pre-determined frequency, wherein the signal related to the negative direction current is determined according to the switching time signal of the power switch and the current of the power switch.

14. The method for controlling a resonant wireless power transmitter circuit of claim 10, wherein the step of generating the impedance control signal includes:
comparing the current of the power switch and a first reference voltage to generate a negative direction current signal;
delaying the switching time signal of the power switch to generate a delayed switching time signal;
masking the negative direction current signal by the delayed switching time signal to generate a negative direction current pulse;
filtering the negative direction current pulse to generate a filter output signal, wherein the filter output signal is in a continuous analog form; and
outputting the filter output signal as a candidate of the impedance control signal.

15. The method for controlling a resonant wireless power transmitter circuit of claim 14, wherein the step of generating the impedance control signal further includes:
comparing the filter output signal and a second reference voltage to generate a selection signal; and
selecting the filter output signal or the second reference voltage, or selecting the filter output signal or a third reference voltage, to be the impedance control signal according to the selection signal.

16. The method for controlling a resonant wireless power transmitter circuit of claim 10, wherein:
(A) the transmitter coil and the varactor are connected in parallel, in series, or in combination of parallel and series; or
(B) wherein the transmitter coil and the varactor and at least one capacitor are connected in parallel, in series, or in combination of parallel and series.

17. The method for controlling a resonant wireless power transmitter circuit of claim 10, wherein the driver circuit is in one of the following forms: a half bridge driver circuit or a full bridge driver circuit or a class E driver circuit.

18. The method for controlling a resonant wireless power transmitter circuit of claim 10, wherein the driver circuit is configured to be in the form of a differential class E driver circuit;
wherein the driver circuit includes a first transmitter coil and a second transmitter coil connected in series, and wherein:
(A) each of the first transmitter coil and the second transmitter coil is connected with the varactor in parallel, in series, or in combination of parallel and series; or
(B) wherein each of the first transmitter coil and the second transmitter coil is connected with the varactor and at least one capacitor in parallel, in series, or in combination of parallel and series.

19. The resonant wireless power transmitter circuit of claim 1, wherein the varactor is a varactor diode, wherein a control terminal of the varactor diode is coupled to the impedance control signal for adjusting the reactance of the varactor diode.

* * * * *